United States Patent (10) Patent No.: US 7,338,860 B2
Kwon                              (45) Date of Patent:      Mar. 4, 2008

(54) METHODS OF FORMING NON-VOLATILE MEMORY DEVICE HAVING FLOATING GATE

(75) Inventor: Wook-Hyun Kwon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 54 days.

(21) Appl. No.: 11/268,038

(22) Filed: Nov. 7, 2005

(65) Prior Publication Data

US 2006/0099756 A1    May 11, 2006

(30) Foreign Application Priority Data

Nov. 11, 2004   (KR)   .................. 10-2004-0092022

(51) Int. Cl.
*H01L 27/088*    (2006.01)
(52) U.S. Cl. .................. 438/257; 438/258; 257/369
(58) Field of Classification Search ............... 434/257; 438/258, 257
See application file for complete search history.

(56) References Cited

U.S. PATENT DOCUMENTS

| 5,723,350 A | * | 3/1998 | Fontana et al. | ............. 438/257 |
| 6,013,551 A | * | 1/2000 | Chen et al. | .................. 438/264 |
| 6,372,577 B1 | | 4/2002 | Fang | ............................ 438/258 |
| 6,429,073 B1 | * | 8/2002 | Furuhata et al. | ............ 438/258 |
| 6,531,360 B2 | | 3/2003 | Lee | ............................. 438/257 |

FOREIGN PATENT DOCUMENTS

| KR | 1996-0009203 | 3/1996 |
| KR | 1020020029205 | 4/2002 |
| KR | 1020030092997 | 12/2003 |

OTHER PUBLICATIONS

S. M. Sze, Physics of Semiconductor Devices, 1981, Wiley-Interscience (John Wiley & Sons), Second Edition, Chapter 8.*

* cited by examiner

*Primary Examiner*—Chandra Chaudhari
*Assistant Examiner*—Emily Rohm
(74) *Attorney, Agent, or Firm*—Myers Bigel Sibley & Sajovec, P.A.

(57) ABSTRACT

Embodiments of the present invention are directed to methods for forming non-volatile memory devices. A substrate is provided that has a cell region, a first peripheral region, and second peripheral region. A tunnel insulating layer and a preliminary blocking insulating layer are formed on the substrate in the cell region. A blocking insulating layer and a conductive layer are formed on the substrate in the cell region, the first peripheral region, and the second peripheral region. The conductive layer and the blocking insulating layer in the first and second peripheral regions are removed to expose at least a portion of the substrate in the first and second peripheral regions, while leaving the conductive layer and the blocking insulating layer in the cell region.

14 Claims, 13 Drawing Sheets

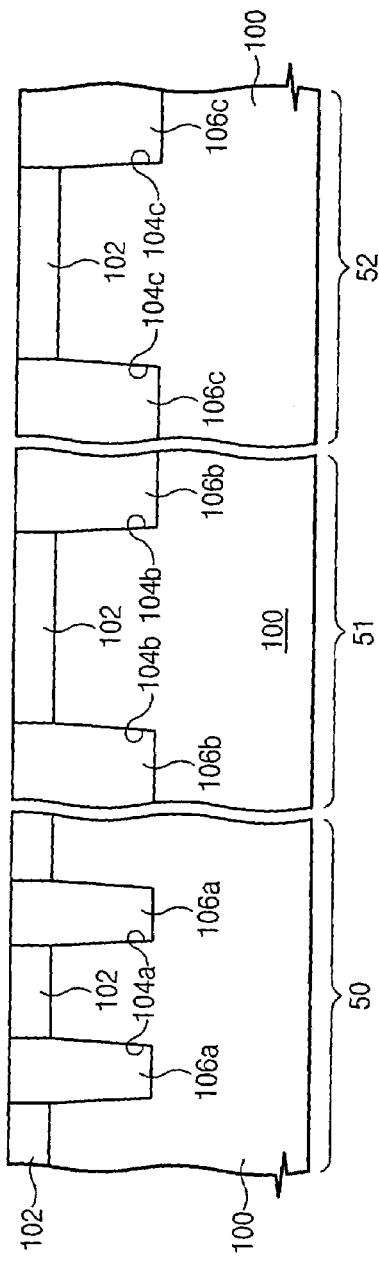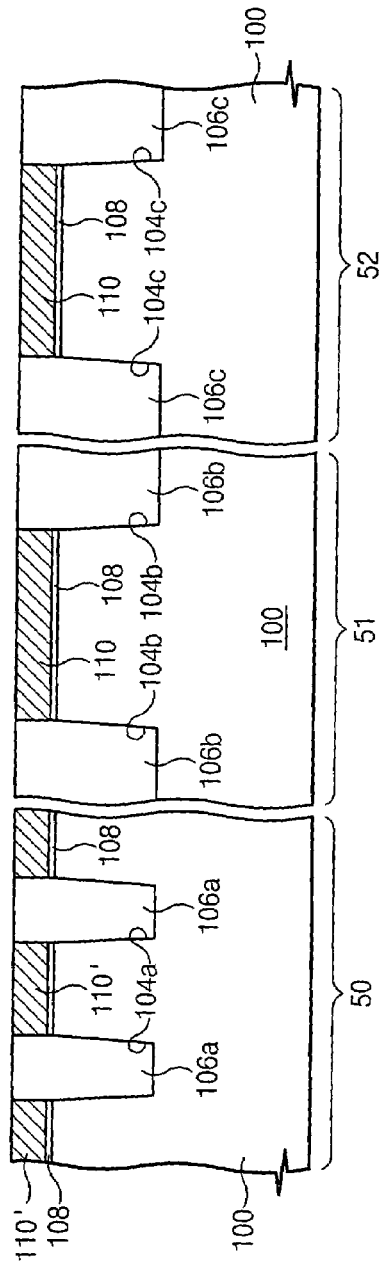

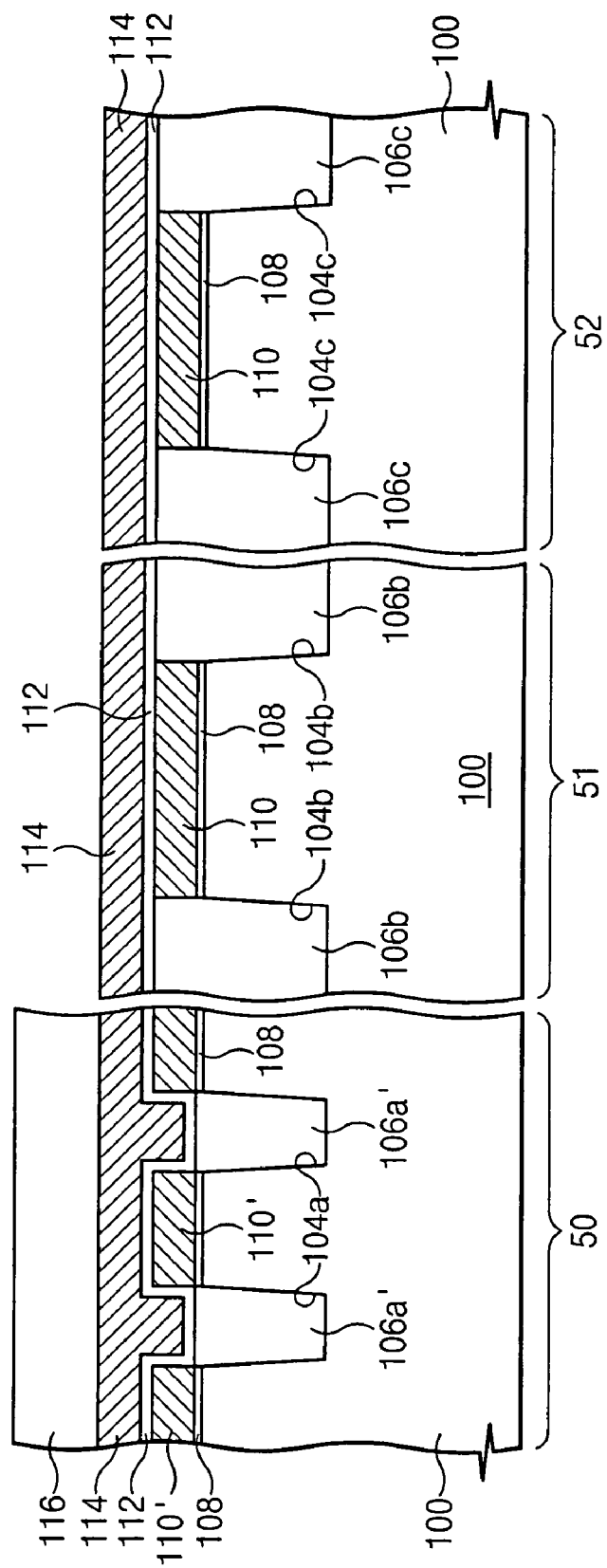

METHODS OF FORMING NON-VOLATILE MEMORY DEVICE HAVING FLOATING GATE

CROSS-REFERENCE TO RELATED APPLICATIONS

This U.S. non-provisional patent application claims priority under 35 U.S.C. § 119 of Korean Patent Application 2004-92022 filed on Nov. 11, 2004, the entire contents of which are hereby incorporated by reference.

BACKGROUND OF THE INVENTION

The present invention relates to methods of forming semiconductor devices and, more particularly, to forming non-volatile memory devices having floating gates.

Semiconductor memory devices for storing data can be categorized as either volatile memory devices or nonvolatile memory devices. Volatile memory devices lose their stored data upon interruption of their power supplies. In contrast, nonvolatile memory devices retain their stored data after interruption of their power supplies. Flash memory devices are an exemplary type of nonvolatile memory devices. A unit cell is used to store data in a flash memory device and may include a floating gate and a control gate electrode that controls inflow/outflow of charges to/from the floating gate. An Oxide-Nitride-Oxide (ONO) layer may be used as an insulation layer between the floating gate and the control gate electrode. Peripheral circuits can include MOS transistors, where use of an ONO in gate electrodes of the MOS transistors in the peripheral circuits may degrade their characteristics.

A method of forming flash memory devices in which a gate electrode included in a MOS transistor of peripheral circuits does not include an ONO layer is disclosed in U.S. Pat. No. 6,372,577 ("the '577 patent").

FIGS. 1 through 4 are cross-sectional views that illustrate a conventional method of forming a flash memory device. The reference sign "a" indicates a cell region with a flash memory cell, and the reference sign "b" indicates a peripheral region with a MOS transistor of a peripheral circuit.

With reference to FIG. 1, device isolation layers 2a and 2b are formed on a substrate 1 having a cell region a and peripheral regions b. The first device isolation layer 2a is formed at the cell region "a" to define a cell active region, and the second device isolation layer 2b is formed in the peripheral region "b" to define a peripheral active region.

A tunnel oxide layer 3 and a first polysilicon layer 4 are sequentially formed on an entire surface of the substrate 1. The first polysilicon layer 4 is patterned to form a first polysilicon pattern 4a on the cell active region. At this time, the first silicon layer 4 of the peripheral region "b" may remain.

An ONO layer 5 is formed on an entire surface of the substrate 1, and a photoresist pattern 6 is formed on the ONO layer 5. The photoresist pattern covers the ONO layer 5 of the cell region "a". At this time, the ONO layer 5 of the peripheral region "b" is exposed.

With reference to FIG. 2, the ONO layer 5 of the peripheral region "b" and the first polysilicon layer 4 are removed using the photoresist pattern 6 as an etch mask. Accordingly, the peripheral active region is exposed. The photoresist pattern 6 is removed to expose the ONO layer 5 of the cell region "a".

A pre-cleaning process is performed on a surface of the exposed peripheral active region. A gate oxide layer 7 is formed in the peripheral active region. The gate oxide layer 7 is formed by a thermal oxidation process.

With reference to FIG. 3, a second polysilicon layer 8 is formed on an entire surface of the substrate 1. The second polysilicon layer 8 of the cell region "a" is in contact with the ONO layer 5, and the second polysilicon layer 8 of the peripheral region "b" is in contact with the gate oxide layer 7.

With reference to FIG. 4, the second polysilicon layer 8, the ONO layer 5, and a first polysilicon pattern 4a are successively patterned to form a floating gate 4b, the ONO pattern 5a, and a control gate electrode 8a, which are sequentially stacked. The control gate electrode 8a crosses over the cell active region. The floating gate 4b is interposed between the control gate electrode 8a and the cell active region. The second polysilicon layer 8 of the peripheral region "b" is patterned to form a peripheral gate electrode 8b crossing over the peripheral active region. In FIGS. 1-4, the cross-section of the cell region "a" is taken along line of the control gate electrode 8a.

As explained above, the ONO layer 5 of the peripheral region "b" is removed by a patterning process using the photoresist pattern 6. The ONO layer 5 of the cell region "a" directly contacts the photoresist pattern 6 during the removal of the ONO layer 5 of the peripheral region "b". Because photoresists are typically formed from organic materials, the ONO layer 5 of the cell region "a" may obtain organic contamination from the photoresist pattern 6 and may thereby have degraded characteristics, and which may reduce reliability of a flash memory device made therewith.

Additionally, during the pre-cleaning process before forming the gate oxide layer 7, the ONO layer 5 of the cell region "a" is exposed and may be partially removed and damaged during the pre-cleaning process. As a result, the characteristic of the ONO layer 5 of the cell region "a" may be degraded and/or the thickness of the ONO layer 5 of the cell region "a" may vary across a flash memory device and/or between manufacturing cycles.

The ONO layer 5 of the cell region "a" is also exposed during an oxidation process for forming the gate oxide layer 7, which may make it difficult to control the thickness of the ONO layer 5.

Accordingly, the reliability of such flash memory devices may be reduced.

SUMMARY OF THE INVENTION

Various embodiments of the present invention are directed to methods for forming non-volatile memory devices. A substrate is provided that has a cell region, a first peripheral region, and second peripheral region. A tunnel insulating layer is formed on the substrate in the cell region. A preliminary floating gate is formed on the tunnel insulating layer in the cell region. A blocking insulating layer is formed on the substrate in the cell region, the first peripheral region, and the second peripheral region. A conductive layer is formed on the blocking insulating layer in the cell region, the first peripheral region, and the second peripheral region. The conductive layer and the blocking insulating layer in the first and second peripheral regions are removed to expose at least a portion of the substrate in the first and second peripheral regions. First and second gate insulating layers are respectively formed on the exposed substrate of the first and second peripheral regions. An undoped silicon layer is formed on the substrate in the cell region, the first peripheral region, and the second peripheral region. The undoped silicon layer in the first peripheral region is doped with impurities of a first-conductivity-type. The undoped silicon layer in the second peripheral region is doped with impurities of a second-conductivity-type.

In some further embodiments, the first gate insulating layer and the second gate insulating layer may be formed simultaneously. The blocking insulating layer may be formed directly on the preliminary floating gate in the cell region. The conductive layer may be formed directly on the blocking insulating layer in the cell region, the first peripheral region, and the second peripheral region. The first gate insulating layer and/or the second gate insulating layer may each have a greater thickness than the tunnel insulating layer in the cell region.

In some further embodiments, the doped silicon layer of the first and second conductivity types in the first and second peripheral regions are patterned to respectively form first and second peripheral gate electrodes. The conductive layer, the blocking insulating layer, and the preliminary floating gate in the cell region are patterned to form a stacked cell gate pattern that includes a floating gate, a blocking insulating pattern, and a control gate electrode.

In some further embodiments, the undoped silicon layer in the cell region is removed when patterning the doped silicon layer of the first and second conductivity types in the first and second peripheral regions to respectively form the first and second peripheral gate electrodes.

In some further embodiments, a first peripheral spacer, a second peripheral spacer, and a cell spacer are formed on both sidewalls of the first peripheral gate electrode, the second peripheral gate electrode, and the cell gate pattern, respectively. A metal layer is formed on the substrate in the cell region, the first peripheral region, and the second peripheral region. A metal silicide layer is formed on the first and second peripheral gate electrodes and the control gate by a silicidation process. The unreacted metal layer is removed after the silicidation process while leaving the metal silicide layer.

In some further embodiments, an etch stop layer is formed that has an etch selectivity with respect to the conductive layer on the blocking insulating layer in the cell region before forming the undoped silicon layer. The etch stop layer is formed at the same time that the first and/or second gate insulating layers are formed, and the undoped silicon layer of the cell region is formed on the etch stop layer.

In some further embodiments, impurity ions of the first-conductivity-type are selectively implanted into the undoped silicon layer of the first peripheral region to form the doped silicon layer of the first-conductivity-type. Impurity ions of the second-conductivity-type are selectively implanted into the undoped silicon layer of the second peripheral region to form the doped silicon layer of the second-conductivity-type. The impurity ions of one of the first-conductivity-type and the second-conductivity-type are N-type impurity ions and the impurity ions of the other one of the first-conductivity-type and the second-conductivity-type are P-type impurity ions.

In some further embodiments, a hard mask layer is formed on the substrate. The hard mask layer and the substrate are successively patterning to form a cell trench in the cell region, a first peripheral trench in the first peripheral region, and a second peripheral trench in the second peripheral region, which respectively define a cell active region of the cell region, a first peripheral active region of the first peripheral region, and a second peripheral active region of the second peripheral region. A cell isolation layer is formed in the cell trench, a first peripheral isolation layer is formed in the first peripheral trench, and a second peripheral isolation layer is formed in the second peripheral trench, each of which have a major upper surface aligned with an upper major surface of the patterned hard mask layer. The patterned hard mask layer is removed to expose the substrate in the cell active region, the first peripheral active region, and the second peripheral active region. The preliminary floating gate is formed on the cell active region.

In some further embodiments, the tunnel insulating layer is formed on the exposed cell active region. Formation of the preliminary floating gate on the tunnel insulating layer in the cell region includes forming a floating gate layer filling regions formed by removal of the patterned hard mask layer in the cell active region, the first peripheral active region, and the second peripheral active region, and planarizing the floating gate layer to align upper major surfaces of the floating gate layer with upper major surfaces of the device isolation layers to form the preliminary floating gate in the cell region. The planarized floating gate layer and the tunnel insulating layer may be removed from the first and second peripheral regions before forming the first and second gate insulating layers on the exposed substrate of the first and second peripheral regions, respectively. The cell isolation layer in the cell trench may be selectively recessed to expose sidewalls of the preliminary floating gate before forming the blocking insulating layer.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIGS. 5 through 14 are cross-sectional views illustrating methods of forming a non-volatile memory device having a floating gate according to some embodiments of the present invention;

DETAILED DESCRIPTION OF EMBODIMENTS OF THE INVENTION

Figure 1:
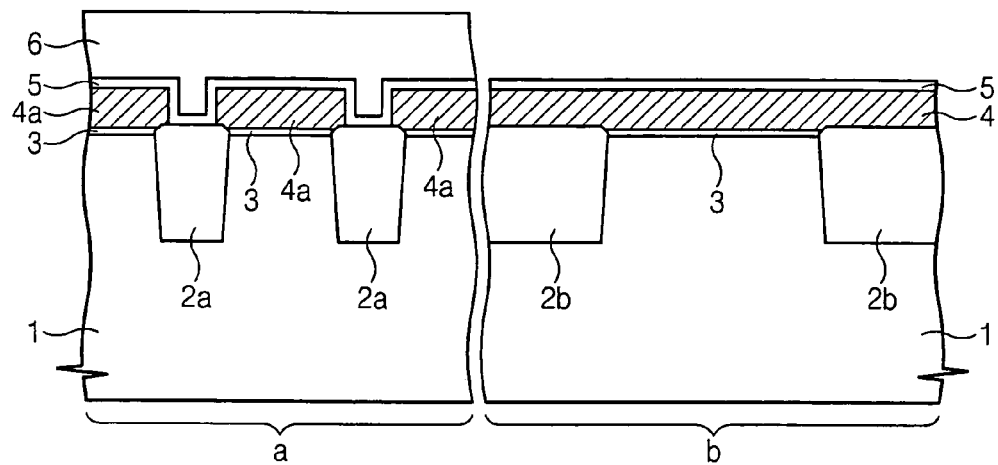
FIGS. 1 through 4 are cross-sectional views illustrating a method of forming a conventional flash memory device.
Figure 2:
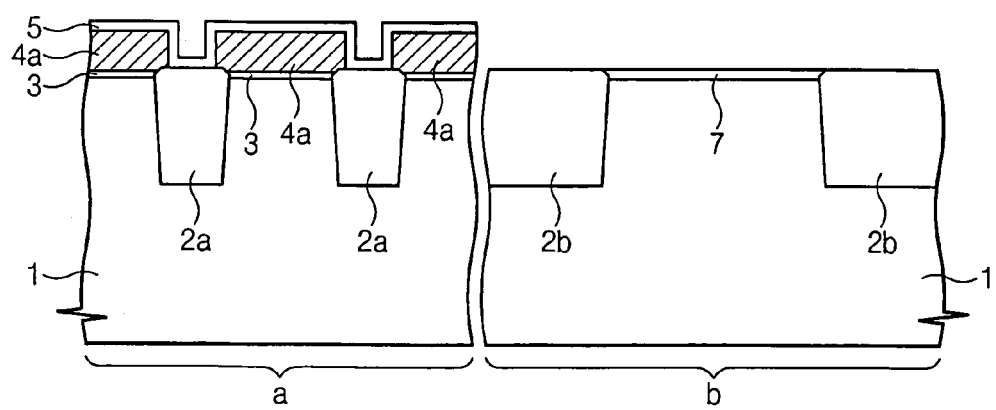
Figure 3:
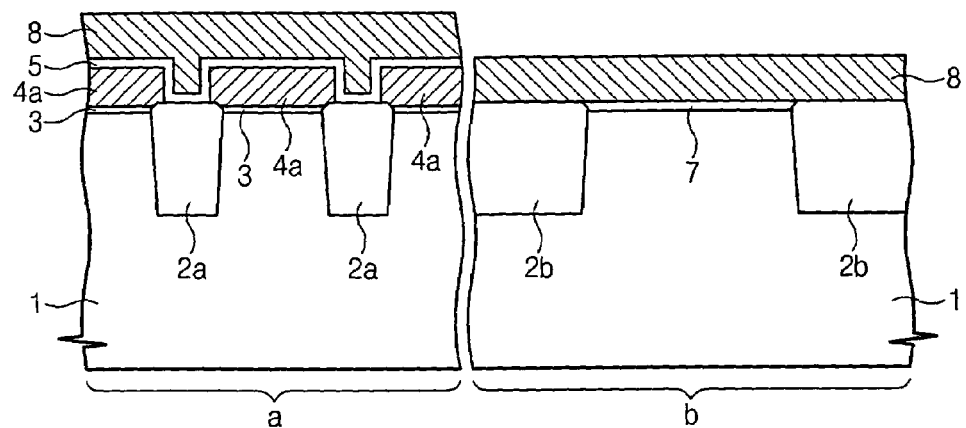
Figure 4:
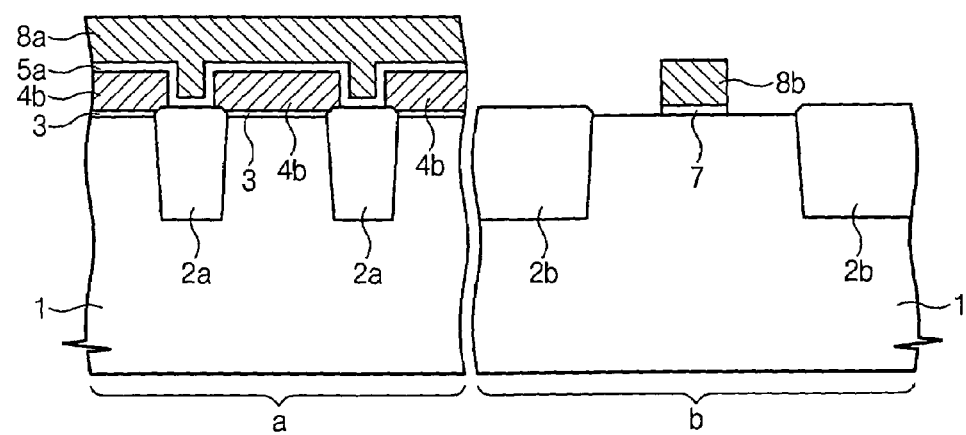

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 15:
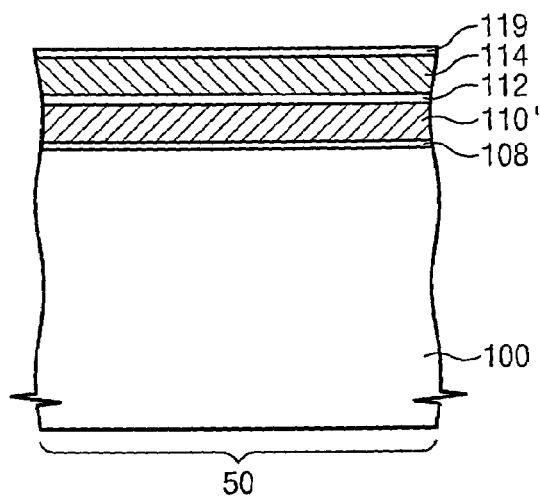
FIG. 15 is a cross-sectional view taken along line I-I' of FIG. 12 according to some embodiments of the present invention.
Figure 16:
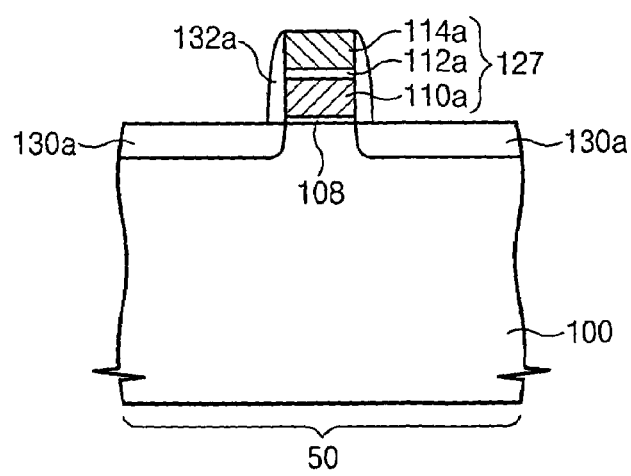
FIG. 16 is a cross-sectional view taken along line II-II' of FIG. 13 according to some embodiments of the present invention.
Figure 17:
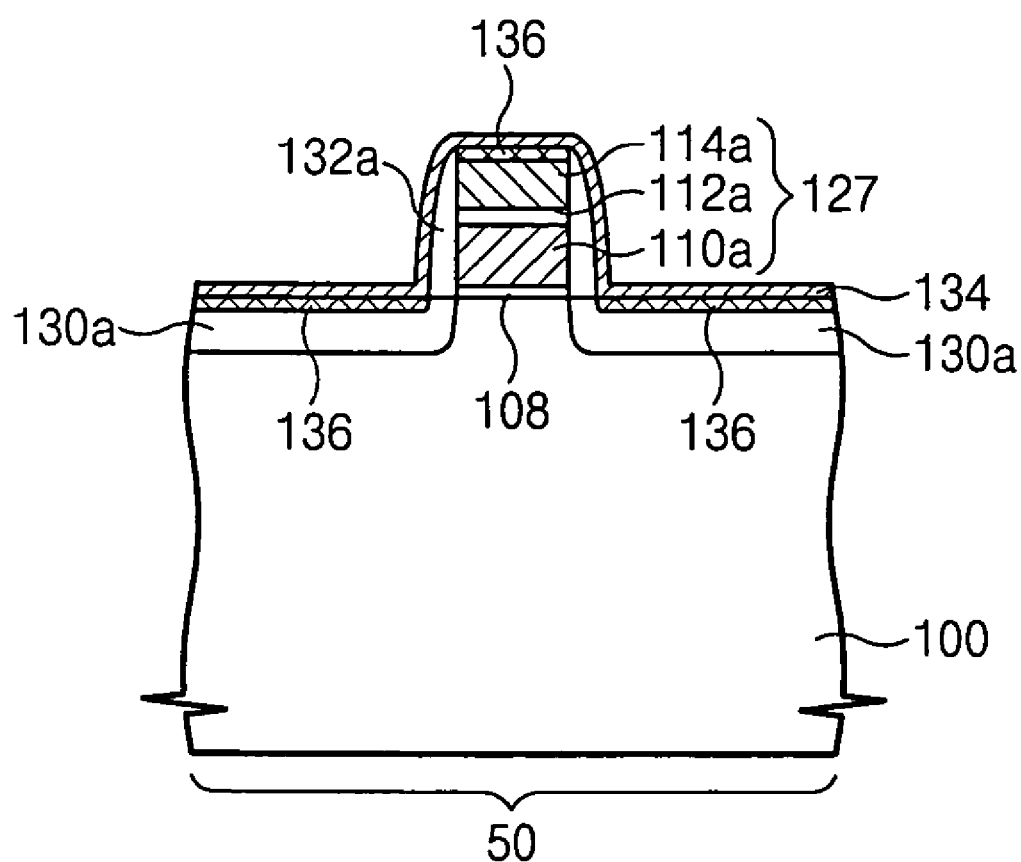
FIG. 17 is a cross-sectional view taken along line III-III' of FIG. 14 according to some embodiments of the present invention.

FIGS. 5 through 14 are cross-sectional views illustrating methods of forming a non-volatile memory device having a floating gate in accordance with some embodiments of the present invention. FIGS. 15, 16, and 17 are cross-sectional views taken along lines I-I' of FIG. 12, II-II' of FIG. 13, and III-III' of FIG. 14, respectively.

Referring to FIG. 5, a substrate 100 having a cell region 50, a first peripheral region 51, and a second peripheral region 52 is provided. The cell region 50 is a region in which a non-volatile memory cell having a floating gate is formed. One of the first and second peripheral regions 51 and 52 is a region where an NMOS transistor of a peripheral circuit is formed, and the other one is a region in which a PMOS transistor is formed.

A hard mask layer 102 is formed on an entire surface of the substrate 100. Then, the hard mask layer 102 and the substrate 100 are successively patterned to form a cell trench 104a of the cell region 50, a first peripheral trench 104b of the first peripheral region 51, and a second peripheral trench 104c of the second peripheral region 52. The cell trench 104a, the first peripheral trench 104b, and the second peripheral trench 104c define a cell active region, a first peripheral active region, and a second peripheral active region, respectively.

A device isolation insulating layer filling the trenches 104a, 104b, and 104c is formed on an entire surface of the substrate 100. The device isolation insulating layer is planarized until the patterned hard mask layer 102 is exposed, and thereby forming a cell device isolation layer 106a, a first peripheral device isolation layer 106b, and a second peripheral device isolation layer 106c. The device isolation layers 106a, 106b, and 106c may thereby have upper major surfaces that are aligned with the upper major surface of the patterned hard mask layer 102. The device isolation layer may be formed of a silicon oxide layer such as, for example, HDP silicon oxide layer which can have an excellent gap-fill characteristic. The hard mask layer 102 may include a material having an etch selectivity with respect to the substrate. The hard mask layer 102 may include a material having an etch selectivity with respect to the device isolation layer. The hard mask layer 102 may include a silicon nitride layer, and may be formed of a buffer oxide layer (e.g., a silicon oxide layer) and a silicon nitride layer which are sequentially stacked.

Referring to FIG. 6, the patterned hard mask layer 102 is removed to expose the cell active region, the first peripheral active region, and the second peripheral active region and to form recessed regions. Accordingly, the recessed regions are surrounded by the device isolation layers 106a, 106b, and 106c and are over the active regions. Upper surfaces of the device isolation layers 106a, 106b, and 106c are higher than exposed surfaces of the active regions.

A tunnel insulating layer 108 is formed on the exposed active regions. The tunnel insulating layer 108 may be formed of a thermal oxide layer.

A floating gate layer is formed on the substrate 100 having the tunnel insulating layer 108 to fill the recessed regions. The floating gate layer is planarized until the device isolation layers 106a, 106b, and 106c are exposed. The planarized floating gate layers 110' and 110 fill the recessed regions of the cell region 50, the first peripheral region 51, and the second peripheral region 52. The planarized floating gate layer 110' of the cell region 50 is referred to as a preliminary floating gate 110'. The preliminary floating gate 110' can thereby be directly on the tunnel insulating layer 108 and self-aligned with the cell active region through it being formed in the recessed regions. The floating gate layer may be formed from silicon. For example, the floating gate layer may be formed from undoped polysilicon or doped polysilicon. The floating gate layer may have an impurity doping concentration that is appropriate for use as a floating gate.

It is to be understood that the preliminary floating gate may be formed by other methods in accordance with some embodiments. For example, an upper surface of the device isolation layers 106a, 106b, and 106c may be adjacent to surfaces of the active regions. The tunnel insulating layer 108 and the floating gate layer may be formed. The floating gate layer is patterned to form the preliminary floating gate. The preliminary floating gate may thereby be aligned with the cell region by an alignment step of a photolithography process. The floating gate layer of the first and second peripheral regions 51 and 52 may remain.

Referring to FIG. 7, the cell device isolation layer 106a is selectively recessed to expose sidewalls of the preliminary floating gate 110', which may increase a coupling ratio of a non-volatile memory cell by increasing an overlap area between a subsequently formed floating gate and control gate electrode. The upper surface of the recessed cell device isolation layer 106a is adjacent to an upper surface of the cell active region. Accordingly, most of sidewalls of the preliminary floating gate 110' may be exposed. Because the cell device isolation layer 106a is recessed, it may be preferable for the first and second peripheral device isolation layers 106b and 106c to be covered with a mask pattern (not shown), so that the first and second peripheral device isolation layers 106b and 106c are not recessed. Accordingly, a step difference between the cell region 50 and the peripheral regions 51 and 52 may be reduced.

A blocking insulating layer 112 and a conductive layer 114 are sequentially formed on an entire surface of the substrate 100. The blocking insulating layer may be formed of an ONO layer. Moreover, the blocking insulating layer 112 may include a high dielectric layer having a higher dielectric constant than a silicon nitride layer. For instance, the blocking insulating layer 112 may include a metal oxide layer such as aluminum oxide layer, hafnium oxide layer, or lathane oxide layer. As the dielectric constant of the blocking insulating layer 112 is increased, the coupling ratio of a non-volatile memory cell is increased. As a result, it may be possible to reduce an operation voltage of the memory cell. A control gate electrode can be formed from the conductive layer 114 in a subsequent process, and may be formed from doped polysilicon.

A mask pattern 116 is formed on the substrate 100. The mask pattern 116 covers the conductive layer 114 of the cell region 50. At this time, the conductive layer 114 of the first and second peripheral regions 51 and 52 is exposed. The mask pattern 116 may be formed of a photoresist layer.

Figure 8:
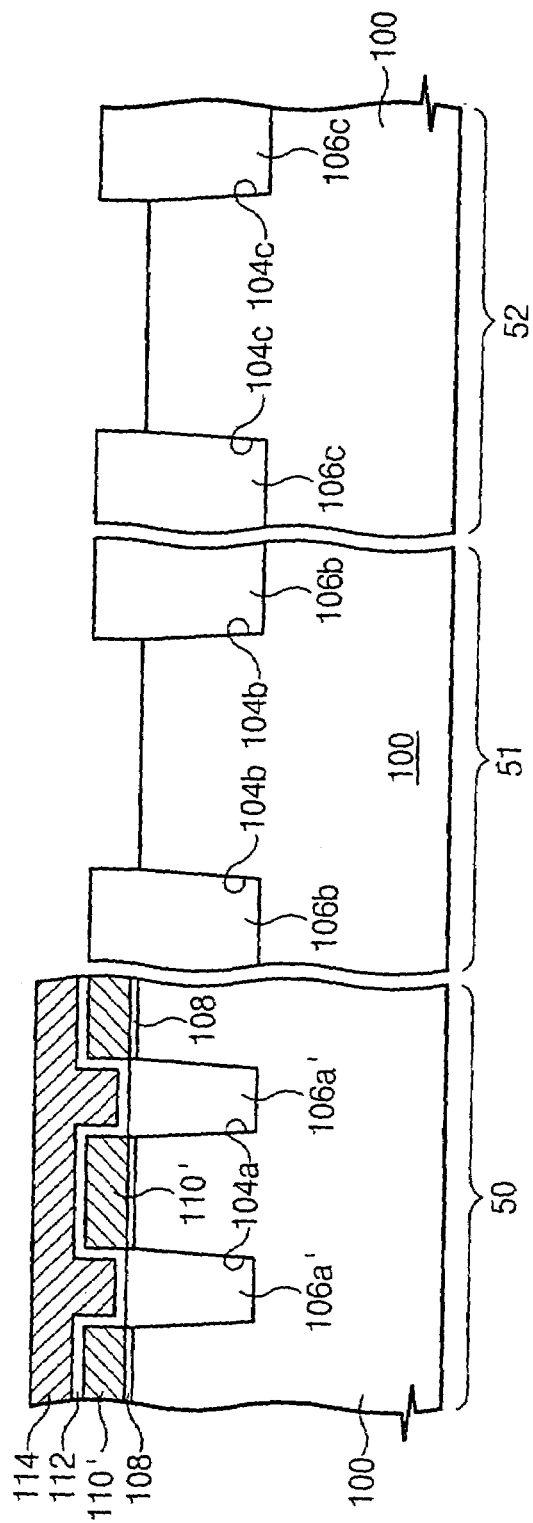

Referring to FIG. 8, the conductive layer 114, the blocking insulating layer 112, the planarized floating gate 110, and the tunnel insulating layer 108 of the peripheral regions 51 and 52 are removed using the mask pattern as an etch mask and to expose the first and second peripheral active regions.

During the process of removing the blocking insulating layer 112 of the peripheral regions 51 and 52, the blocking insulating layer 112 of the cell region is protected by the conductive layer 114.

Figure 9:
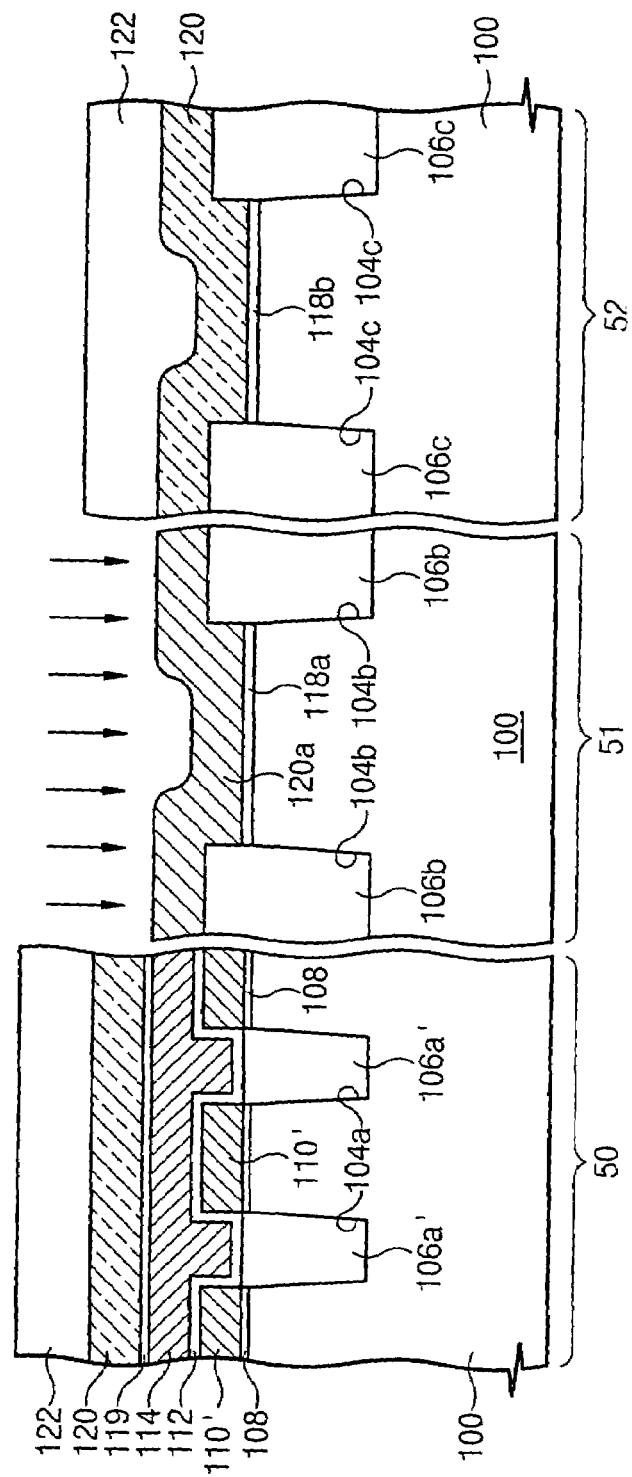

Referring to FIG. 9, a first gate insulating layer 118a is formed on the exposed first peripheral active region, and a second gate insulating layer 118b is formed on the exposed second peripheral active region. Before forming the gate insulating layers 118a and 118b, a pre-cleaning process may be performed with respect to surfaces of the exposed first and second peripheral active regions. During the pre-cleaning process, the blocking insulating layer 112 of the cell region 50 is protected by the conductive layer 114.

The gate insulating layers 118a and 118b can be formed to have a thickness that is optimized for a MOS transistor of a peripheral circuit. For example, if MOS transistors formed in the peripheral regions 51 and 52 are high voltage MOS transistors, the gate insulating layers 118a and 118b may be relatively thick. In contrast, if MOS transistors formed in the peripheral regions 51 and 52 are lower voltage MOS transistors, the gate insulating layers 118a and 118b may be relatively thin. The gate insulating layers 118a and 118b may be thicker than the tunnel insulating layer 108. The first and second gate insulating layers may be formed at the same time.

When one of the first and second peripheral regions 51 and 52 is a region of a high voltage MOS transistor, and the other one is a region of a low voltage MOS transistor, the first and second gate insulating layers 118a and 118b can be sequentially formed to have different thickness. The first and second gate insulating layers 118a and 118b may be formed of a thermal oxide layer.

An etch stop layer 119 may be formed on the conductive layer 114. The etch stop layer 119 is formed of a material having an etch selectivity with respect to the conductive layer 114. The etch stop layer 119 may be formed by thermally oxidizing the conductive layer formed of doped polysilicon. In particular, the etch stop layer 119 may be formed together with the first and/or second gate insulating layers 118a and 118b.

An undoped silicon layer 120 is formed on an entire surface of the substrate 100. The undoped silicon layer 120 may be formed of undoped polysilicon. The undoped silicon layer 120 may be formed by a Chemical Vapor Deposition process and/or an Atomic Layer Deposition (ALD) process. Because upper surfaces of the first and second peripheral device isolation layers 106b and 106c are higher than an upper surface of the recessed cell device isolation layer, it is possible to reduce a step difference between the cell region 50 and the peripheral regions 51 and 52 in forming the undoped polysilicon layer 120.

A first ion implantation mask pattern 122 is formed on the undoped polysilicon layer 120. The first ion implantation mask pattern 122 covers the undoped silicon layer 120 of the cell region 50 and the second peripheral region 52. At this time, the undoped polysilicon layer 120 of the first peripheral region 51 is exposed.

Impurity ions of a first-conductivity-type are implanted using the first ion implantation mask pattern 122 into the undoped polysilicon layer 120 of the first peripheral region 51 to form a doped polysilicon layer 120a of the first-conductivity-type.

Figure 10:
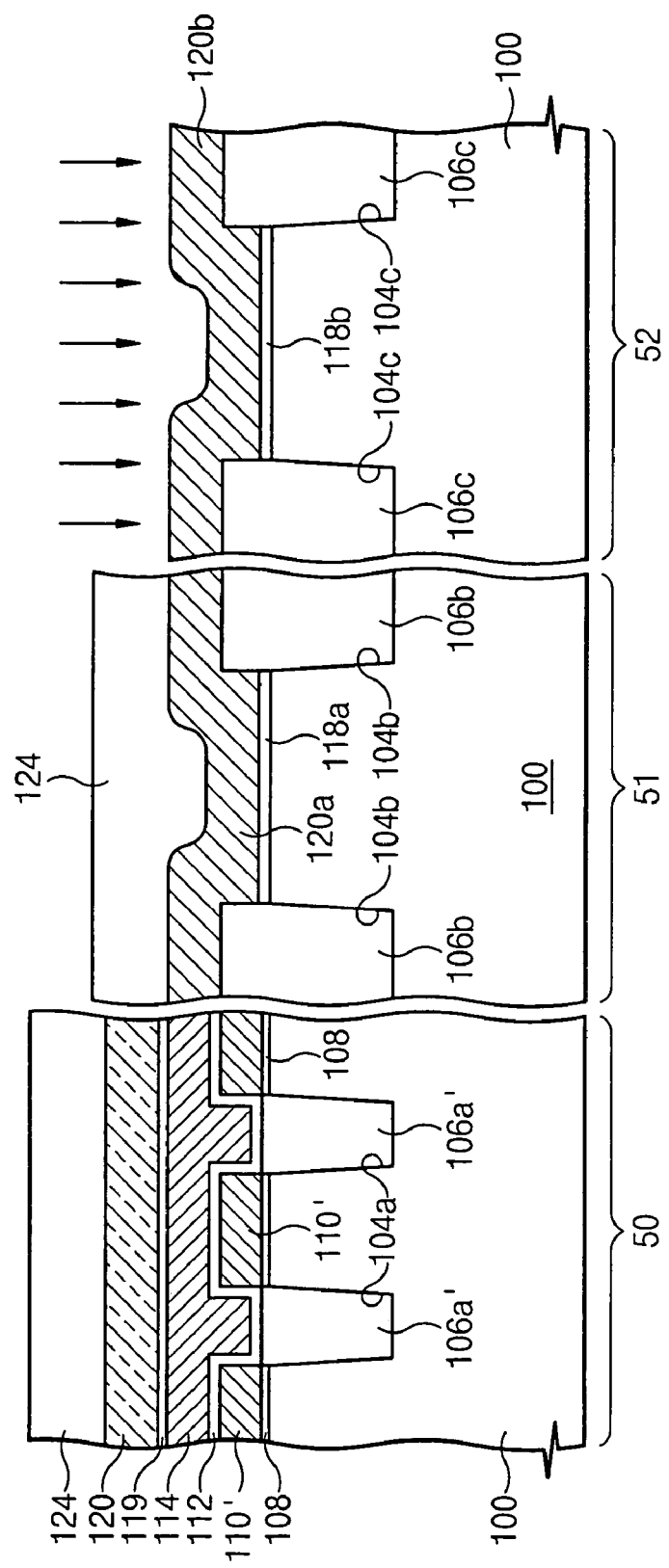

Referring to FIG. 10, the first ion implantation mask pattern 122 is removed. A second ion implantation mask pattern 124 is formed on the substrate 100. The second ion implantation mask pattern 124 covers the undoped polysilicon layer 120 of the cell region "a" and the doped polysilicon layer 120a of the first-conductivity-type of the first peripheral region 51. At this time, the undoped polysilicon layer 120 of the second peripheral region 52 is exposed.

Impurity ions of a second-conductivity-type are implanted using the second ion implantation mask pattern 124 into the undoped polysilicon layer of the second peripheral region 52 to form a doped polysilicon layer 120b of the second-conductivity-type.

The impurities of the second-conductivity-type are different from those of the first-conductivity-type. For example, impurities of one of the first and second conductivity-types can be N-type impurities while impurities of the other one of the first and second conductivity-types can be P-type impurities.

When a NMOS transistor is formed in the first peripheral region 51 and a PMOS transistor is formed in the second peripheral region 52, the doped polysilicon layer 120a of the first-conductivity-type is a N-type doped polysilicon layer, and the doped polysilicon layer 120b of the second-conductivity-type is P-type doped polysilicon layer. On the contrary, when a PMOS transistor is formed in the first peripheral region 5 and a NMOS transistor is formed in the second peripheral region 52, the doped polysilicon layer 120a of the first-conductivity-type is a P-type doped polysilicon layer, and the doped polysilicon layer 120b of the second-conductivity-type is N-type doped polysilicon layer.

For purposes of further illustration and discussion only, NMOS and PMOS transistors that are respectively formed in the first and second peripheral regions 51 will be described. Accordingly, the doped polysilicon layer of the first-conductivity-type 120a is hereinafter referred to as a N-type doped polysilicon layer 120a. The doped silicon layer of the second-conductivity-type is referred to as a P-type doped polysilicon layer 120b.

Figure 11:
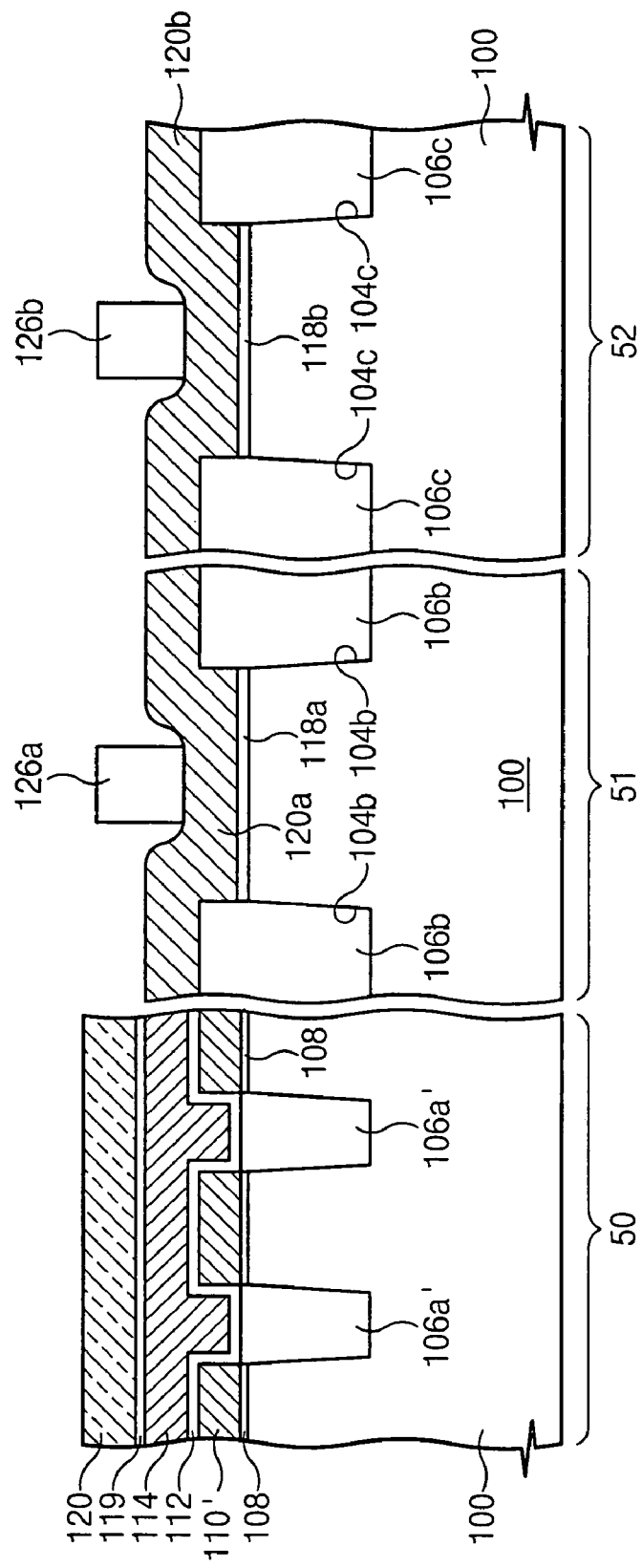

Referring to FIG. 11, the second ion implantation mask pattern 124 is removed from the substrate 100. After removing the second ion implantation mask pattern 124, a thermal process may be performed to activate the first and second impurities.

First and second gate mask patterns 126a and 126b are formed on the substrate 100. The first gate mask pattern 126a is formed on the N-type doped silicon layer of the first peripheral region 51, and the second gate mask pattern 126b is formed on the P-type doped silicon layer of the second peripheral region 52. At this time, the undoped silicon layer 120 of the cell region 50 is exposed.

Figure 12:
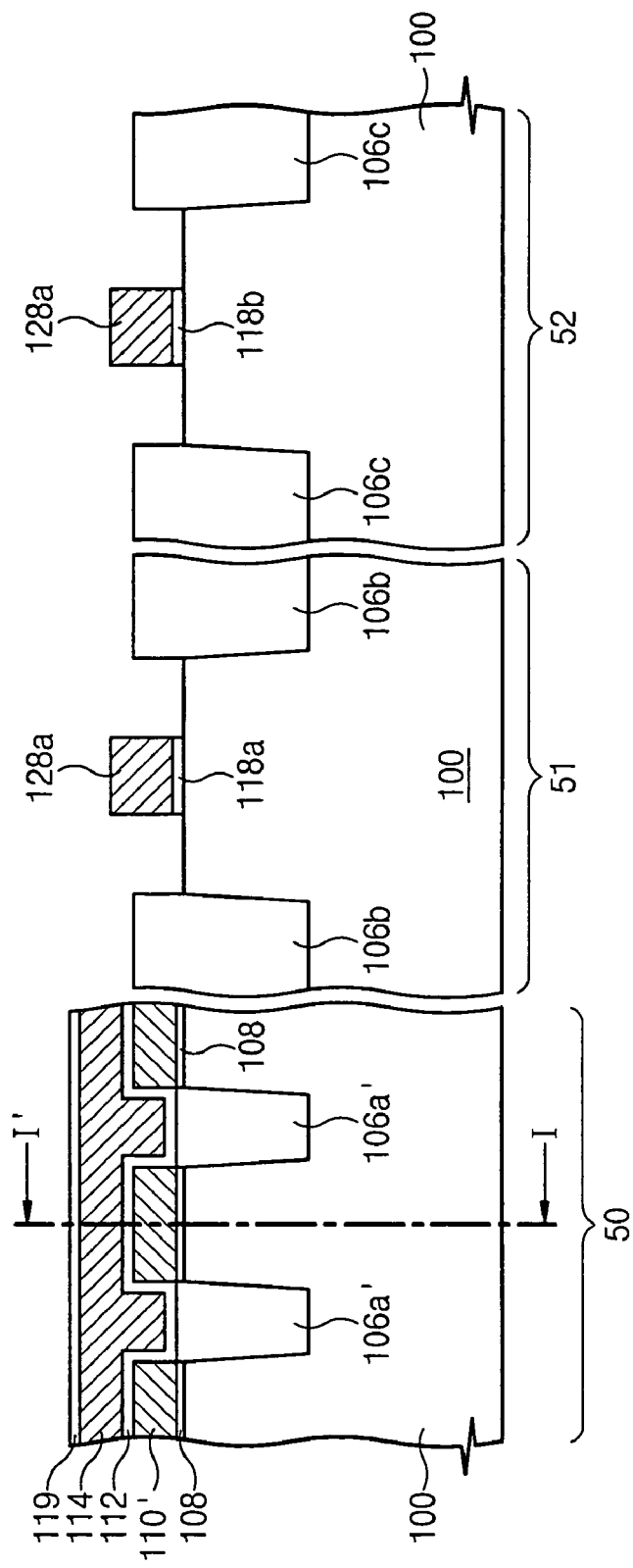

Referring to FIGS. 12 and 15, the N-type and P-type doped silicon layers 120a and 120b are etched using gate mask patterns 126a and 126b to form first and second peripheral gate electrodes 128a and 128b. At this time, the undoped silicon layer 120 of the cell region 50 is also removed. When the undoped silicon layer 120 of the cell region 50 is removed, the etch stop layer 119 protects the conductive layer 114 of the cell region 50 from an etch process for the peripheral gate electrodes 128a and 128b. The first peripheral gate electrode 128a corresponds to a NMOS gate electrode 128a, and the second peripheral gate electrode 128b corresponds to a PMOS gate electrode 128b.

Figure 13:
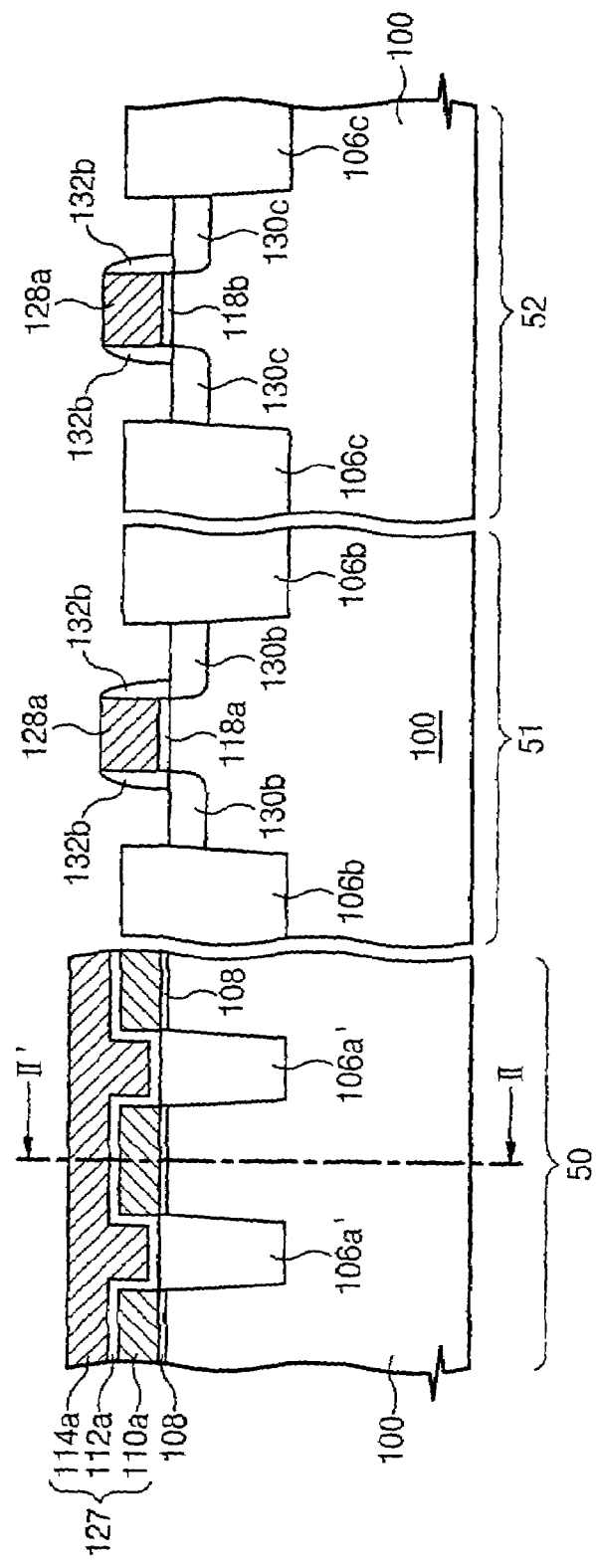

Referring to FIGS. 13 and 16, the etch stop layer 119, the conductive layer 114, the blocking insulating layer 112, and the preliminary floating gate 110' of the cell region 50 are successively patterned to form a cell gate pattern 127 and the patterned etch stop layer 119, which are sequentially stacked. The cell gate pattern 127 includes a floating gate 110a, a blocking insulating pattern 112a, and a control gate electrode 114a, which are sequentially stacked. The control gate electrode 114a is formed from the conductive layer 114 and crosses the cell active region. The floating gate 110a is interposed between the control gate electrode 114a and the tunnel insulating layer 108. While the cell gate pattern 127 is formed, the NMOS and PMOS gate electrodes 128a and 128b are protected by a mask pattern (not shown) used in a patterning process of the cell gate pattern 127.

A cell impurity doped layer 130a is formed in the cell active region at both sides of the cell gate pattern 127. An impurity doped layer 130b of a first-conductivity-type is formed in the first peripheral active region at both sides of the NMOS gate electrode 128a, and an impurity doped layer 130c of a second-conductivity-type is formed in the second peripheral active region at both sides of the PMOS gate electrode 128b. The impurity doped layer of the first-conductivity-type 130b is doped with impurities having the same type as impurities of the NMOS gate electrode 128a. Thus, the impurity doped layer 130b of the first-conductivity-type is a N-type impurity doped layer 130b. Similarly, the impurity doped layer 130c of the second-conductivity-type is doped with impurities having the same type as impurities of the PMOS gate electrode 128b. Thus, the impurity doped layer 130c of the second-conductivity-type is a P-type impurity doped layer 130c.

The cell impurity doped layer 130a may be formed at the same time with one of the N-type impurity doped layer 130b or P-type impurity doped layer 130c. The cell impurity doped layer 130a may be doped with N-type impurities. Accordingly, the cell impurity doped layer 130a may be formed at the same time as the N-type impurity doped layer 130b.

An insulating spacer layer is conformally formed on an entire surface of the substrate 100. The insulating spacer layer is then anisotropically etched to form a cell spacer 132a, a first peripheral spacer 132b, and a second peripheral spacer 132c at both sidewalls of the cell gate pattern 127, the NMOS gate electrode 128a, and the PMOS gate electrode 128b, respectively. At this time, the patterned etch stop layer 119 on the control gate electrode 114a is also removed during the anisotropic etching process.

Through the anisotropic etching process, the spacers 132a, 132b, and 132c can be formed and, at the same time, upper surfaces of the gate electrodes 127, 128a, and 128b are exposed. The insulating spacer layer may be formed of a material having the same etch rate as the etch stop layer 119, such as a silicon oxide. The spacer may include a silicon oxide layer and a silicon nitride layer, which are sequentially stacked.

Impurity ions can be selectively and additionally implanted into the cell region 50, the first peripheral region 51, and the second peripheral region 52 as needed for a non-volatile memory device, so that the cell impurity doped layer 130a, the N-type impurity doped layer 130b, and/or the P-type impurity doped layer 130c may have a lightly doped drain (LDD) structure or an extended source/drain structure.

Figure 14:
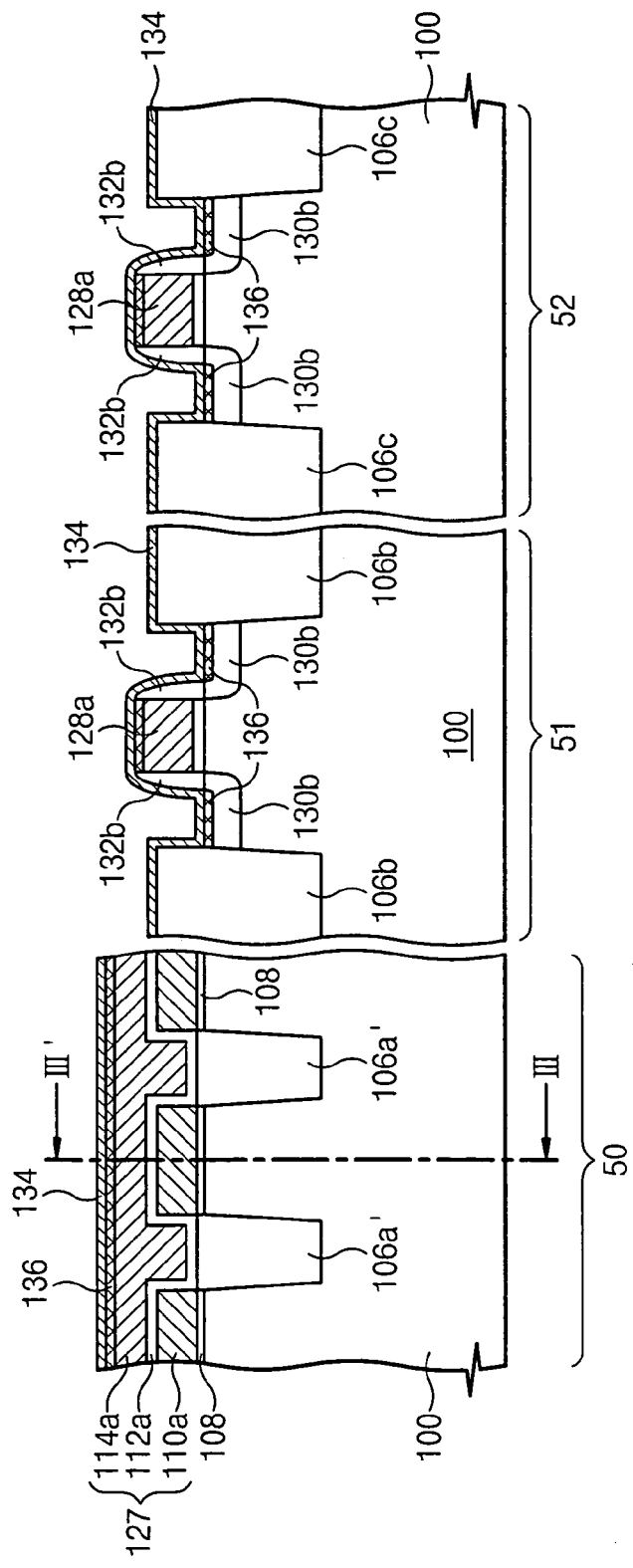

Referring to FIGS. 14 and 17, a metal layer 134 is deposited on an entire surface of the substrate 100. A metal silicide 136 may be formed by performing a silicidation process on the metal layer 134 with respect to the substrate 100. The metal silicide 136 is formed on an exposed upper surfaces of the gate electrodes 114a, 128a, and 128b and exposed surfaces of the impurity doped layers 130a, 130b, and 130c. The process for depositing the metal layer 134 and the silicidation process may be performed using in-situ manner. The metal layer 134 may be formed of cobalt, nickel, or titanium. Accordingly, the metal silicide 136 may be formed of cobalt silicide, nickel silicide, or titanium silicide.

Unreacted metal layer 134 may be removed from the substrate 100.

As explained above, the blocking insulating layer 112 of the cell region 50 is protected by the conductive layer 114 when the blocking insulating layer of the peripheral regions 51 and 52 is removed. Moreover, during the pre-cleaning process carried out before forming the gate insulating layers 118a and 118b, the blocking insulating layer 112 of the cell region 50 is protected by the conductive layer 114. While the gate insulating layers 118a and 118b are formed, the blocking insulating layer 112 of the cell region 50 is protected by the conductive layer 114. Consequently, characteristic degradation and/or thickness variation with respect to the blocking insulating layer 112 of the cell region 50 may be reduced/prevented. Thus, problems associated with ONO layers of a conventional cell region (e.g., characteristic degradation or thickness variation of an ONO layer) may be reduce/prevented, which may improve reliability of associated non-volatile memory devices.

Also, after the gate insulating layers 118a and 118b are formed, the undoped silicon layer 120 is formed and different type impurities are selectively implanted. As a result, the doped silicon layer 120a of the first-conductivity-type and the doped silicon layer 120b of the second-conductivity-type are formed in the first and second peripheral regions 50 and 51. Accordingly, an NMOS gate electrode 128a that includes a NMOS transistor may be formed from a N-type impurity doped silicon, and a PMOS gate electrode 128b that includes a PMOS transistor may be formed from a P-type impurity doped silicon. As a result, the NMOS and PMOS gate electrodes 128a and 128b can have optimized work functions so that the NMOS and PMOS transistors have surface channels. Thus, an operation speed of the PMOS transistor as well as a controllability with respect to a channel region under the PMOS transistor may be improved. Accordingly, the characteristics of the PMOS and NMOS transistors may be improved.

The blocking insulating layer 112 of the cell region 50 is protected, and the characteristic of the PMOS and NMOS transistors may be improved, which may improve the reliability of associated non-volatile memory devices.

As previously explained, while a blocking insulating layer of the peripheral regions is removed, a blocking insulating layer of a cell region is protected by a conductive layer. In addition, during a pre-cleaning process before forming gate insulating layers of the peripheral regions, the blocking insulating layer is protected by the conductive layer. Furthermore, while gate insulating layers of the peripheral regions are formed, the blocking insulating layer of the cell region is protected by the conductive layer. Accordingly, the characteristic degradation and/or thickness variation of a conventional ONO layer may be reduced/prevented.

Moreover, after forming the gate insulating layers, an undoped silicon layer may be formed on an entire surface of a substrate, and impurities may be selectively implanted into the undoped silicon layer of the respective peripheral regions. Thus, a gate electrode of a NMOS transistor may be formed of silicon doped with N-type impurities, and a gate electrode of a PMOS transistor may be formed of silicon doped with P-type impurities. As a result, the NMOS and PMOS transistors can have a surface channel, which may improve the characteristics of the NMOS and PMOS transistors.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a non-volatile memory device, the method comprising:
    providing a substrate having a cell region, a first peripheral region, and second peripheral region;
    forming a tunnel insulating layer on the substrate in the cell region;
    forming a preliminary floating gate on the tunnel insulating layer in the cell region;
    forming a blocking insulating layer on the substrate in the cell region, the first peripheral region, and the second peripheral region;
    forming a conductive layer on the blocking insulating layer in the cell region, the first peripheral region, and the second peripheral region;
    removing the conductive layer and the blocking insulating layer in the first and second peripheral regions to expose at least a portion of the substrate in the first and second peripheral regions, while leaving the conductive layer and the blocking insulating layer in the cell region;
    forming a first gate insulating layer on the exposed substrate of the first peripheral region;
    forming a second gate insulating layer on the exposed substrate of the second peripheral region;
    forming an undoped silicon layer on the substrate in the cell region, the first peripheral region, and the second peripheral region;
    doping the undoped silicon layer in the first peripheral region with impurities of a first-conductivity-type;
    doping the undoped silicon layer in the second peripheral region with impurities of a second-conductivity-type; and
    forming an etch stop layer having an etch selectivity with respect to the conductive layer on the blocking insulating layer in the cell region before forming the undoped silicon layer,
    wherein the etch stop layer is formed at the same time that the first and/or second gate insulating layers are formed, and the undoped silicon layer of the cell region is formed on the etch stop layer.

2. The method as set forth in claim 1, wherein forming a first gate insulating layer and forming a second gate insulating layer are carried out simultaneously.

3. The method as set forth in claim 1, wherein the blocking insulating layer is formed directly on the preliminary floating gate in the cell region.

4. The method as set forth in claim 1, wherein the conductive layer is formed directly on the blocking insulating layer in the cell region, the first peripheral region, and the second peripheral region.

5. The method as set forth in claim 1, wherein at least one of the first and second gate insulating layers has a greater thickness than the tunnel insulating layer in the cell region.

6. The method as set forth in claim 5, wherein the first and second gate insulating layers each have a greater thickness than the tunnel insulating layer in the cell region.

7. The method as set forth in claim 1, further comprising:
    patterning the doped silicon layer of the first and second conductivity types in the first and second peripheral regions to respectively form first and second peripheral gate electrodes; and patterning the conductive layer, the blocking insulating layer, and the preliminary floating gate in the cell region to form a stacked cell gate pattern comprising a floating gate, a blocking insulating pattern, and a control gate electrode.

8. The method as set forth in claim 7, wherein patterning the doped silicon layer of the first and second conductivity types in the first and second peripheral regions to respectively form first and second peripheral gate electrodes comprises removing the undoped silicon layer in the cell region.

9. The method as set forth in claim 7, further comprising:
forming a first peripheral spacer, a second peripheral spacer, and a cell spacer on sidewalls of each of the first peripheral gate electrode, the second peripheral gate electrode, and the cell gate pattern, respectively;
forming a metal layer on the substrate in the cell region, the first peripheral region, and the second peripheral region;
forming a metal silicide layer on the first and second peripheral gate electrodes and the control gate by a silicidation process; and
removing unreacted metal after the silicidation process while leaving the metal silicide layer.

10. The method as set forth in claim 1, wherein:
doping the undoped silicon layer in the first peripheral region with impurities of a first-conductivity-type comprises selectively implanting impurity ions of the first-conductivity-type into the undoped silicon layer of the first peripheral region to form the doped silicon layer of the first-conductivity-type;
doping the undoped silicon layer in the second peripheral region with impurities of a second-conductivity-type comprises selectively implanting impurity ions of the second-conductivity-type into the undoped silicon layer of the second peripheral region to form the doped silicon layer of the second-conductivity-type; and
the impurity ions of one of the first-conductivity-type and the second-conductivity-type are N-type impurity ions and the impurity ions of the other one of the first-conductivity-type and the second-conductivity-type are P-type impurity ions.

11. The method as set forth in claim 1, further comprising:
forming a hard mask layer on the substrate;
successively patterning the hard mask layer and the substrate to form a cell trench in the cell region, a first peripheral trench in the first peripheral region, and a second peripheral trench in the second peripheral region, which respectively define a cell active region of the cell region, a first peripheral active region of the first peripheral region, and a second peripheral active region of the second peripheral region;
forming a cell isolation layer in the cell trench, a first peripheral isolation layer in the first peripheral trench, and a second peripheral isolation layer in the second peripheral trench, each of which have a major upper surface aligned with an upper major surface of the patterned hard mask layer; and
removing the patterned hard mask layer to expose the substrate in the cell active region, the first peripheral active region, and the second peripheral active region,
wherein the preliminary floating gate is formed on the cell active region.

12. The method as set forth in claim 11, wherein:
the tunnel insulating layer is formed on the exposed cell active region; and
forming a preliminary floating gate on the tunnel insulating layer in the cell region comprises:
forming a floating gate layer filling regions formed by removal of the patterned hard mask layer in the cell active region, the first peripheral active region, and the second peripheral active region; and
planarizing the floating gate layer to align upper major surfaces of the floating gate layer with upper major surfaces of the device isolation layers to form the preliminary floating gate in the cell region.

13. The method as set forth in claim 12, further comprising removing the planarized floating gate layer and the tunnel insulating layer from the first and second peripheral regions before forming the first and second gate insulating layers on the exposed substrate of the first and second peripheral regions, respectively.

14. The method as set forth in claim 12, further comprising selectively recessing the cell isolation layer in the cell trench to expose sidewalls of the preliminary floating gate before forming the blocking insulating layer.

* * * * *